United States Patent
Lyons et al.

[11] Patent Number: 6,090,712
[45] Date of Patent: *Jul. 18, 2000

[54] SHALLOW TRENCH ISOLATION FORMATION WITH NO POLISH STOP

[75] Inventors: Christopher F. Lyons, Fremont, Calif.; Basab Bandyopadhyay, Austin, Tex.; Nick Kepler, Saratoga, Calif.; Olov Karlsson, San Jose, Calif.; Larry Wang, San Jose, Calif.; Effiong Obok, Sunnyvale, Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/992,489

[22] Filed: Dec. 18, 1997

[51] Int. Cl.[7] .................................................. H01L 21/461
[52] U.S. Cl. ...................... 438/691; 438/697; 438/700; 438/691; 438/692
[58] Field of Search ................................. 438/694, 697, 438/700, 691, 692

[56] References Cited

U.S. PATENT DOCUMENTS

| | | | |
|---|---|---|---|
| 5,494,857 | 2/1996 | Cooperman et al. | 437/228 |
| 5,712,185 | 1/1998 | Tsai et al. | 437/67 |
| 5,872,043 | 2/1999 | Chen | 438/424 |
| 5,895,255 | 4/1999 | Tsuchiaki | 438/427 |

*Primary Examiner*—Benjamin L. Utech
*Assistant Examiner*—Venessa Pérez-Ramos

[57] ABSTRACT

An insulated trench isolation structure is formed in a semiconductor substrate omitting a barrier nitride polish stop layer while avoiding substrate damage, thereby simplifying trench formation and improving planarity. After trench fill, polishing is conducted to effect substantial planarization without exposing the substrate surface, thereby avoiding substrate damage. Etching is then conducted to expose the substrate surface. The omission of the barrier nitride polish stop avoids generation of a topographical step at the substrate/trench fill interface, thereby enhancing the accuracy of subsequent photolithographic techniques in forming features with minimal dimensions.

12 Claims, 4 Drawing Sheets

SHALLOW TRENCH ISOLATION FORMATION WITH NO POLISH STOP

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor.

A typical method of trench formation comprises initially growing a pad oxide layer on the substrate or epitaxial layer, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, a thermal oxidation is performed to form an oxide liner on the walls and base of the trench to control the silicon-silicon dioxide interface quality. The trench is then refilled with an insulating material ("or trench fill"), such as silicon dioxide derived from tetraethyl orthosilicate (TEOS). The surface is then planarized, as by chemical-mechanical polishing (CMP), using the barrier nitride layer as a polish stop. After polishing the nitride and pad oxide are stripped off the active areas to complete the trench isolation structure.

When creating the STI structure, it is considered desirable for the uppermost surface of the substrate or epitaxial layer to be flush (i.e., coplanar) with the uppermost surface of the trench fill, in order to maximize the performance of the finished device, and to provide a flat topography for subsequent processing steps, particularly photolithographic processing, thereby enabling the formation of minimal dimension features with accuracy and increased manufacturing throughput. However, planarity is adversely affected by conventional techniques, primarily due to the application of the barrier nitride layer as a polish stop.

FIG. 1 illustrates a conventional STI structure formed by conventional STI methodology and comprising substrate 1, oxide liner 2, and insulating material 3. After the insulating material 3 has been applied and planarized using the barrier nitride layer as a polish stop, the barrier nitride layer and pad oxide layer are stripped off, creating a step having a height S between the main surface 1a of the substrate 1 and the uppermost surface 3a of the insulating material 3. Thus, the use of a conventional barrier nitride layer as a polish stop creates a topographical step, rendering it difficult to photolithographically process subsequent layers of the device, particularly in forming features with fine dimensions, thereby adversely affecting process yield and production cost. This problem becomes more acute as circuit geometry is continuously reduced and the height of the step challenges the depth of focus limitations of conventional photolithographic equipment.

In copending Application Ser. No. 08/992,488 filed Dec. 18, 1997 (Attorney Docket No. 1033-309), a method is disclosed for forming an STI structure by omitting the barrier nitride polish stop layer, avoiding the generation of a topographical step and achieving substantial planarity. The disclosed method simplifies the STI formation process by applying the photoresist mask directly to the pad oxide layer formed on a main surface of a semiconductor substrate or an epitaxial layer on a semiconductor substrate. The substrate or epitaxial layer is then etched to form a trench. The mask is subsequently removed, an oxide liner is grown in the trench, and the trench is filled with an insulating material. Finally, the insulating material is planarized, as by CMP, down to the main surface, such that the main surface and the uppermost surface of the insulating material are substantially coplanar.

The methodology disclosed in copending Application Ser. No. 08/992,488 (Attorney Docket No. 1033-309) simplifies STI methodology by omitting, the barrier nitride polish stop layer with a corresponding reduction in manufacturing cost, and avoids generating a topographical step, thereby enhancing photolithographic accuracy, particularly with respect to fine circuit geometry. However, when the insulating material is planarized by CMP down to the main surface, damage to the silicon of the main surface may occur due to overpolishing. Such damage may be physical (scratching) or chemical (contamination of the silicon with other materials). In copending Application Ser. No. 08,992,488 (Attorney Docket No. 1033-309), such substrate damage is repaired by performing additional process steps, such as wet or plasma etching to remove a layer and restore fresh silicon at the main surface, or reoxidation and removal of the resulting oxide layer by wet or plasma etching. A further increase in manufacturing throughput can be achieved if such substrate repair procedures can be omitted without adversely impacting device integrity.

There exists a need for a method of manufacturing a semiconductor device with an STI structure, wherein the uppermost surface of the substrate or epitaxial layer is substantially coplanar with the uppermost surface of the trench, without causing damage to the uppermost surface of the substrate or epitaxial layer requiring additional remedial processing.

SUMMARY OF THE INVENTION

An object of the present invention is a method of manufacturing a semiconductor device having an insulated trench formed in a semiconductor substrate with improved planarity of the uppermost trench/substrate interface without damaging the uppermost surface of the substrate or epitaxial layer, thereby enhancing subsequent photolithographic processing and increasing manufacturing throughput.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; providing a mask on the pad oxide layer, the mask containing a pattern having an opening with a dimension substantially equal to a dimension of the trench; etching to remove portions of the pad oxide layer and to form the trench having an internal surface; removing the mask; forming an oxide liner on the internal surface of the trench; depositing an insulating material to fill the trench and cover the pad oxide layer; polishing such that an uppermost surface of the insulating material is substantially planar without exposing the main surface; and etching to expose the main surface such that the uppermost surface of the insulating material is substantially coplanar with the main surface.

Another aspect of the present invention is a method of manufacturing an integrated circuit on a semiconductor substrate, which method comprises: forming a silicon oxide pad layer on a main surface of the substrate or an epitaxial layer formed on the substrate: providing a photoresist mask on the pad oxide layer, the mask containing a pattern having an opening for a trench; etching to remove portions of the underlying pad oxide layer and to form the trench having an internal surface; removing the mask; thermally growing a thin silicon oxide liner on the internal surface of the trench: depositing an insulating material to fill the trench and cover the pad oxide layer, the insulating material comprising silicon dioxide derived from tetraethyl orthosilicate (TEOS) by low pressure chemical vapor deposition (LPCVD), silicon dioxide derived from silane by LPCVD, or a high density plasma oxide; chemical-mechanical polishing such that an uppermost surface of the insulating material is substantially planar without exposing the main surface; and wet etching or plasma etching to expose the main surface such that the uppermost surface of the insulating material is substantially coplanar with the main surface.

Additional objects and advantages of the present invention will become readily apparent to those skilled in this art from the following, detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention constitutes an improvement in the methodology disclosed in copending Application Ser. No. 08/992,488 (Attorney Docket No. 1033-309), achieving the advantages disclosed therein while avoiding polishing damage to the main surface of the substrate or epitaxial layer without employing a barrier nitride polish stop layer. Conventionally formed trenches adversely impact planarity and, hence, severely limit the capability of conventional photolithographic techniques in forming features with fine dimension; e.g., less than about $0.25\mu$, particularly less than about $0.18\mu$. The present invention enables the manufacture of a semiconductor device without such undesirable topological steps at the trench/substrate interface, by omitting the conventional barrier nitride polish stop layer and, yet, avoids damage to the main surface, thereby avoiding, additional remedial processing to restore fresh silicon at the main surface and increasing manufacturing throughput.

According to the methodology of the present invention, a photoresist mask is applied directly to a pad oxide layer formed on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the substrate is etched to form a trench, an oxide liner is grown in the trench surface, and the trench is filled with an insulating material. The insulating material is planarized, as by CMP. However, in accordance with the present invention, the planarizing polishing step is strategically controlled to avoid substrate damage. In an embodiment of the present invention, CMP is controlled by stopping the polishing process before reaching the main substrate surface. At this point, the main substrate surface is not exposed and, hence, does not suffer any damage due to polishing. In accordance with this embodiment, after cessation of CMP, the insulating material is etched, using a uniform etching process; e.g., wet or plasma etching, down to the main surface, such that the main surface and the uppermost surface of the insulating material are substantially coplanar.

By stopping the polishing process before reaching the main substrate surface, damage to the silicon of the main substrate surface is avoided. The removal of the insulating material down to the main surface is completed by an etching process, thereby avoiding any substantial damage to the substrate surface and the need to perform subsequent remedial processing to restore fresh silicon at the main substrate surface.

Figure 1:
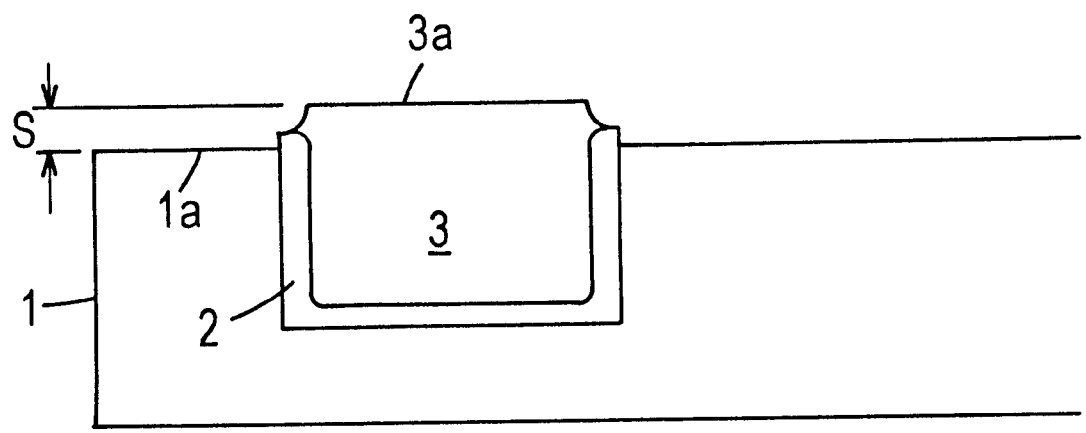
FIG. 1 is cross-sectional view of a conventional STI structure.
Figure 2A:
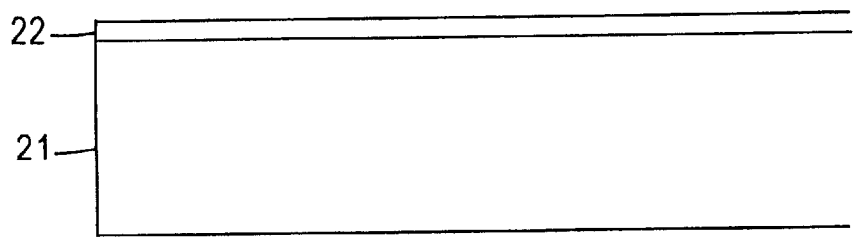
FIGS. 2A, 2B, 2A, 2C, 2D, 2E, 2F, 2G, 2H, and 2I schematically illustrate sequential phases of a method in accordance with an embodiment of the present invention.

FIGS. 2A–2I depict sequential phases in forming a semiconductor device in accordance with an embodiment of the present invention. Referring to FIG. 2A, substrate 21 is prepared with a substantially planar surface, typically a semiconductor substrate comprising doped monocrystalline silicon or an epitaxial layer formed on a semiconductor substrate in accordance with conventional practices. Pad oxide layer 22 is then grown on substrate 21. Pad oxide layer 22 is typically silicon oxide and can be thermally grown on the substrate or deposited by chemical vapor deposition (CVD) to a thickness of about 100 Å to about 200 Å. In another embodiment, a pad oxide containing a thinned thermally-grown silicon oxide layer and a buffer polycrystalline silicon layer is employed as the pad layer. FIG. 2A illustrates silicon substrate 21 and the pad oxide layer 22.

Figure 2B:
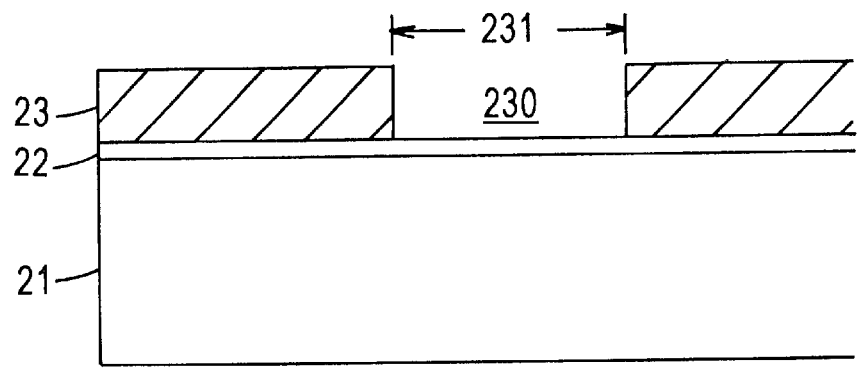
Figure 2C:
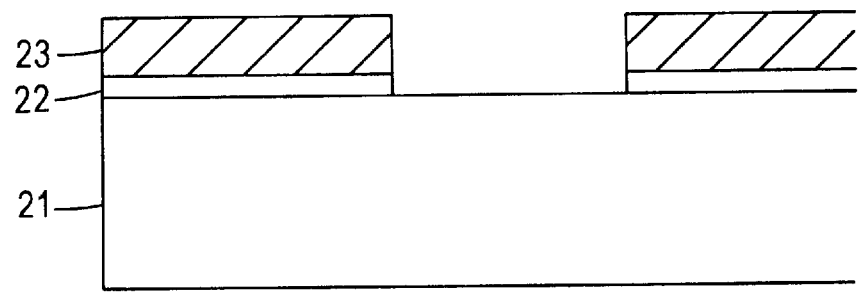
Figure 2D:
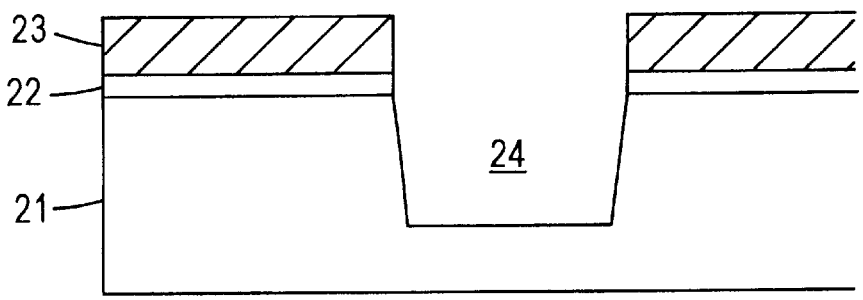

Adverting to FIG. 2B, photoresist mask 23 is formed on pad oxide layer 22, and comprises a pattern defined by openings 230, which have a width 231 substantially corresponding to the width of the subsequently formed trench, typically about $0.25\mu$ or less. Pad oxide layer 22 is then etched away as shown in FIG. 2C. The etching continues into the substrate 21 to form shallow trench 24, as shown in FIG. 2D. Trench 24 is typically etched to a depth of about 2500 Å to about 4000 Å; e.g., about 3000 Å.

Figure 2E:
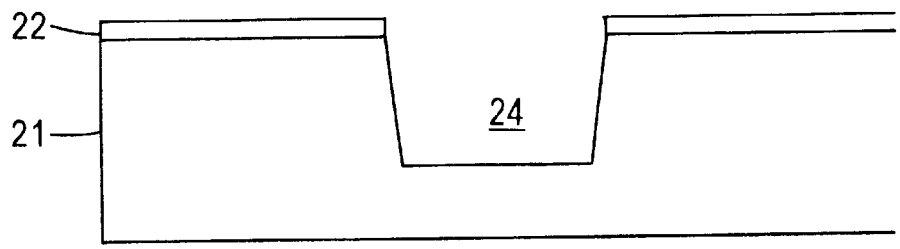
Figure 2F:
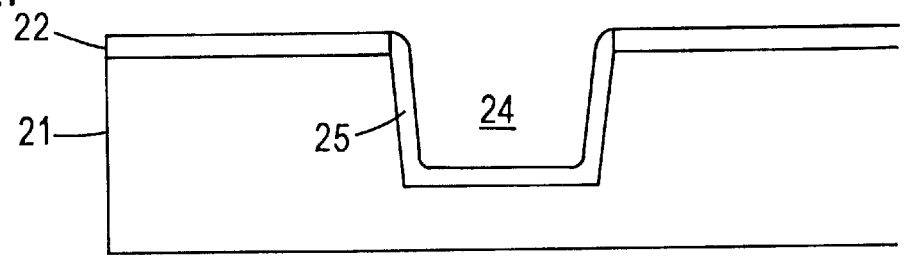

When the etching of trench 24 is completed, photoresist 23 is stripped off pad oxide layer 22, resulting in the trench shown in FIG. 2E. Thereafter, the trench surface is thermally oxidized to form oxide liner 25 on the inner surface of trench 24, typically at a temperature of about 1000° C. or higher. FIG. 2F illustrates trench 24 with the completed liner 25.

Figure 2G:
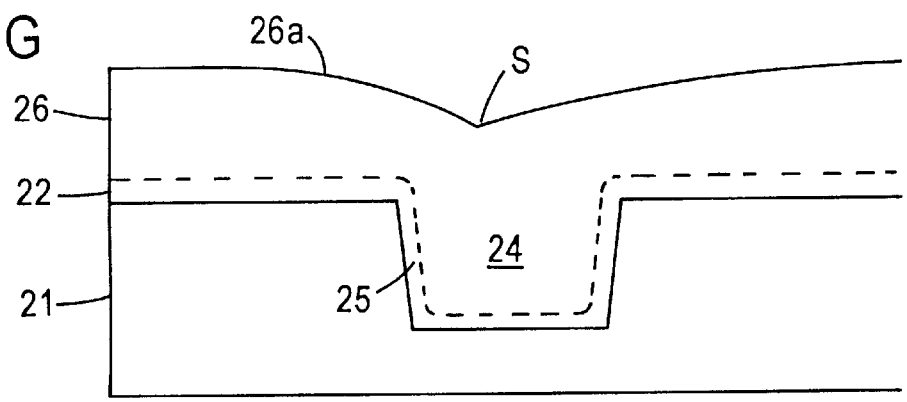

Subsequent to formation of oxide liner 25, trench 24 is filled with a suitable insulating material 26, as shown in FIG. 2G. Such insulating material can comprise silicon dioxide derived from TEOS by LPCVD or derived from silane by LPCVD. The trench 24 can also be filled with a high density plasma (HDP) oxide, preferably employing the methodology disclosed in copending Application Ser. No. 08/924,133, filed Sep. 5, 1997 (Attorney Docket No. 1033-352), the entire disclosure of which is hereby incorporated herein by reference. The pad oxide layer 22 and the oxide liner 25 are shown as dotted lines in FIG. 2G because after the trench 24 is filled with insulating material 26, they are indistinguishable from the insulating material 26.

Figure 2H:
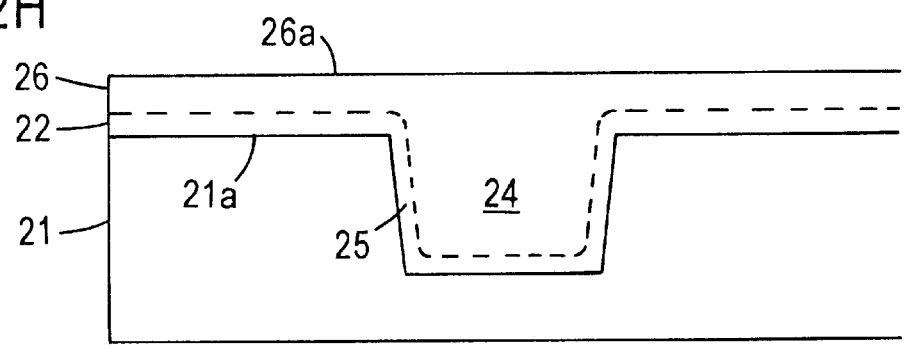
Figure 2I:
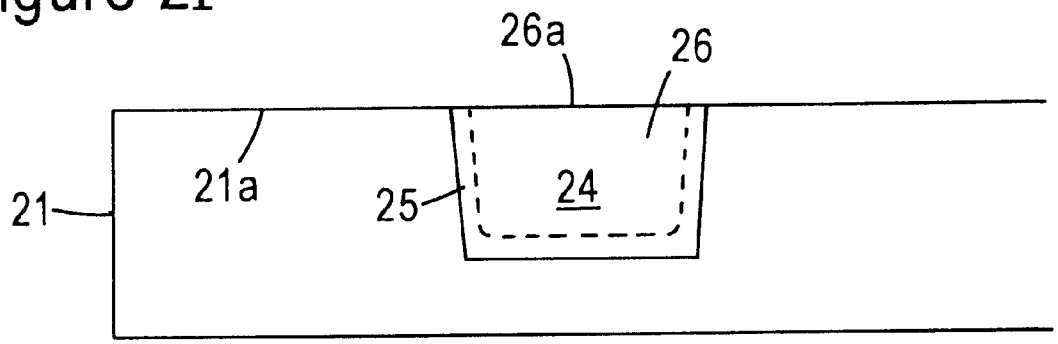

After filling the trench, the insulating material is planarized, as by CMP (FIG. 2H). In accordance with an embodiment of the present invention, CMP is strategically controlled by polishing the insulating material 26 until the uppermost surface 26a of the insulating material 26 is substantially flat, but before the main surface 21a is exposed; that is, until topography such as seam S, caused by the presence of trench 24, in the insulating material 26 (FIG. 2G) is polished out. After CMP is stopped, insulating material 26 is etched, as by wet etching or plasma etching, to expose the main surface 21a, such the main surface 21a and the uppermost surface 26a of the insulating material 26 are substantially coplanar, as shown in FIG. 2I. The substantial coplanarity of the main surface 21a and the uppermost surface 26a of the insulating material results because the uppermost surface 26a is first flattened, enabling uniform etching across the insulating material 26. Given the objectives of the present invention, one having ordinary skill in the art can easily optimize the thickness of the deposited insulating material and the CMP process parameters (e.g., pressure, polishing time) to achieve planarization before exposing the main substrate surface.

The inventive methodology enables formation of an STI structure substantially coplanar with the main surface, without employing a conventional barrier nitride polish stop layer and without damaging the main substrate surface, thereby simplifying the STI formation process and increasing manufacturing throughput. The present invention is applicable to the manufacture of various types of semiconductor devices having STI, particularly high density semiconductor devices having a design rule of about $0.25\mu$ and under.

The present invention can be practiced by employing conventional materials, methodology and equipment. Accordingly, the details of such materials, equipment and methodology are not set forth herein in detail.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an insulated trench formed in a semiconductor substrate or in an epitaxial layer on said semiconductor substrate, which method comprises:

forming a pad oxide layer on a main surface of said substrate or epitaxial layer;

providing a mask directly on said pad oxide layer, said mask containing a pattern having an opening with a dimension substantially equal to a dimension of said trench;

etching to remove portions of said underlying pad oxide layer and to form said trench having an internal surface;

removing said mask;

forming an oxide liner on said internal surface of said trench;

depositing an insulating material to fill said trench and cover said pad oxide layer;

polishing said insulating material such that an uppermost surface of said insulating material is substantially planar without exposing said main surface; and etching said insulating material to expose said main surface after polishing said insulating material, such that said uppermost surface of said insulating material is substantially coplanar with said main surface.

2. The method according to claim 1, wherein said pad oxide layer comprises silicon dioxide.

3. The method according to claim 1, wherein said mask comprises a photoresist mask.

4. The method according to claim 1, wherein said opening in said mask has a width substantially equal to a width of said trench.

5. The method according to claim 4, wherein said width of said opening is about $0.25\mu$ or under.

6. The method according to claim 5, wherein said trench is etched to a depth of about 2500 Å to about 4000 Å.

7. The method according to claim 6, wherein said trench is etched to a depth of about 3000 Å.

8. The method according to claim 2, comprising heating at a temperature of about 1000° C. or higher to thermally grow a silicon oxide liner.

9. The method according to claim 2, wherein said insulating material comprises silicon dioxide derived from tetraethyl orthosilicate (TEOS) by low pressure chemical vapor deposition (LPCVD), silicon dioxide derived from silane by LPCVD, or a high density plasma oxide.

10. The method according to claim 9, comprising polishing by chemical-mechanical polishing.

11. The method according to claim 10, comprising etching by wet etching or plasma etching.

12. A method of manufacturing an integrated circuit on a semiconductor substrate, which method comprises:

forming a silicon oxide pad layer on a main surface of said substrate or an epitaxial layer formed on said substrate;

providing a photoresist mask on said pad oxide layer, said mask containing a pattern having an opening for a trench;

etching to remove portions of said underlying pad oxide layer and to form said trench having an internal surface;

removing said mask;

thermally growing a thin silicon oxide liner on said internal surface of said trench;

depositing an insulating material to fill said trench and cover said pad oxide layer, said insulating material comprising silicon dioxide derived from tetraethyl orthosilicate (TEOS) by low pressure chemical vapor deposition (LPCVD), silicon dioxide derived from silane by LPCVD, or a high density plasma oxide;

chemical-mechanical polishing such that an uppermost surface of said insulating material is substantially planar without exposing said main surface; and wet etching or plasma etching to expose said main surface, such that said uppermost surface of said insulating material is substantially coplanar with said main surface.

* * * * *